(12) United States Patent
Lim (10) Patent No.: US 8,878,266 B2
(45) Date of Patent: Nov. 4, 2014

(54) CMOS IMAGE SENSOR AND METHOD FOR FABRICATING THE SAME (75) Inventor: Youn-Sub Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 54 days.

(21) Appl. No.: 13/599,721

(22) Filed: Aug. 30, 2012

(65) Prior Publication Data
US 2014/0008708 A1 Jan. 9, 2014

(30) Foreign Application Priority Data

Jul. 6, 2012 (KR) .................. 10-2012-0073964

(51) Int. Cl.
*H01L 27/146* (2006.01)
*H01L 31/18* (2006.01)

(52) U.S. Cl.
USPC 257/292; 438/73; 257/E27.139; 257/E31.055

(58) Field of Classification Search
USPC ............. 257/292, E27.139, E31.055; 438/73
See application file for complete search history.

(56) References Cited

U.S. PATENT DOCUMENTS

2006/0255372 A1 * 11/2006 Patrick et al. ............... 257/225

FOREIGN PATENT DOCUMENTS

| KR | 1020050040026 | 5/2005 |
| KR | 100962470 | 6/2010 |

* cited by examiner

Primary Examiner — Matthew W Such
Assistant Examiner — Monica D Harrison
(74) Attorney, Agent, or Firm — IP & T Group LLP

(57) ABSTRACT

A CMOS image sensor includes a substrate, a gate electrode formed over the substrate, a photodiode formed over the substrate to be substantially aligned with one side of the gate electrode, a floating diffusion region formed over the substrate to be substantially aligned with the other side of the gate electrode, and a blooming pass region formed below the photodiode.

16 Claims, 7 Drawing Sheets

CMOS IMAGE SENSOR AND METHOD FOR FABRICATING THE SAME

CROSS-REFERENCE TO RELATED APPLICATIONS

The present application claims priority of Korean Patent Application No. 10-2012-0073964, filed on Jul. 6, 2012, which is incorporated herein by reference in its entirety.

BACKGROUND

1. Field

Exemplary embodiments of the present invention relate to a semiconductor device fabrication technology, and more particularly, to a complementary metal-oxide semiconductor (CMOS) image sensor and a method for fabricating the same.

2. Description of the Related Art

A complementary metal-oxide semiconductor (CMOS) image sensor is an integrated sensor having a block configured to amplify or process signal in a sensor chip using an active element such as a MOS or CMOS transistor.

In general, a unit pixel of the CMOS image sensor includes one photodiode PD and four NMOS transistors TX, RX, SX, and DX as explained below. The transfer transistor TX transfers photogenerated charges collected by the photodiode PD to a floating diffusion region FD. The reset transistor RX serves to set the potential of a node to a desired value and discharge the photogenerated charges to reset the floating diffusion region FD.

The drive transistor DX serves as a source follower buffer amplifier. The select transistor SX performs addressing through a switching operation.

Here, the transfer transistor TX and the reset transistor RX include a native NMOS transistor, and the drive transistor DX and the select transistor SX include a normal NMOS transistor. The reset transistor RX is a transistor for correlated double sampling (CDS).

That is, in each image pixel of the CMOS image sensor, general CMOS elements are used to implement the photodiode and the transistors. Therefore, the existing CMOS process may be applied. Accordingly, an integrated image signal processing and detecting unit may be provided in a block outside the pixel.

Figure 1:
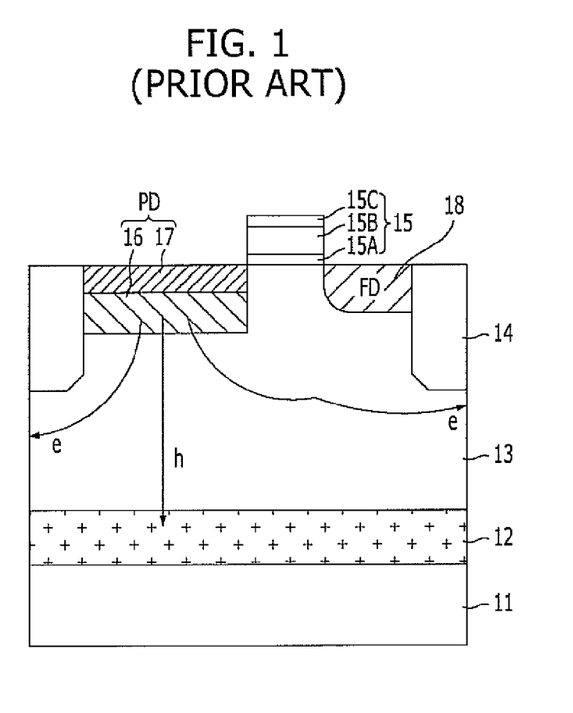
FIG. 1 is a cross-sectional view of a conventional CMOS image sensor.

FIG. 1 is a cross-sectional view of a conventional CMOS image sensor.

Referring to FIG. 1, a punch-through prevention layer 12 is formed over a substrate 11. Furthermore, an epitaxially-grown silicon epitaxial layer 13 is formed over the punch-through prevention layer 12. An isolation layer 14 is formed from the surface of the silicon epitaxial layer 13 to be separated from the punch-through prevention layer 12.

A gate dielectric layer 15A is formed over the silicon epitaxial layer 13, a polysilicon layer 15B is formed over the gate dielectric layer 15A, and a tungsten silicide layer 15C is formed over the polysilicon layer 15B, thereby forming a gate electrode 15 of a transfer transistor TX. An N-type diffusion layer 16 is formed inside the silicon epitaxial layer 13 while aligned with one edge of the gate electrode 15, and a P-type diffusion layer 17 is formed over the N-type diffusion layer 16 and below the surface of the silicon epitaxial layer 13 while aligned with the one edge of the gate electrode 15. As a result, a photodiode PD including the N-type diffusion layer 16 and the P-type diffusion layer 17 is formed. Furthermore, a floating diffusion region 18 is formed inside the silicon epitaxial layer 13 while aligned with the other edge of the gate electrode 15.

In the above-described conventional CMOS image sensor, when light is incident, the N-type diffusion layer 16, which serves as a depletion layer, generates an electron hole pair (EHP). A hole h of the EHP escapes to the punch-through prevention layer 12, and an electron e is stored and then moved to the floating diffusion region 18 through the transfer transistor TX. Then, the electron e is converted into image data.

The conventional CMOS image sensor has concerns regarding the occurrence of dark current and decrease in photosensitivity. That is, when strong light is irradiated from outside for a long time, the photogenerated charges of the photodiode PD are partially transferred to the floating diffusion region 18 through a channel of the gate electrode 15, thereby causing dark current. Accordingly, the photosensitivity decreases.

Here, a technique to apply a negative charge pumping (NCP) bias to the gate electrode 15 may be adopted to prevent the dark current and improve the photosensitivity. In this case, a blooming phenomenon that deteriorates a trade-off characteristic may occur.

The blooming phenomenon includes pixel blooming and dark blooming. In particular, the dark blooming is a defect source that may cause a large yield loss.

The blooming phenomenon occurs due to a channel blocking of a gate electrode based on a barrier increase of the gate electrode caused by the application of the NCP bias to the gate electrode. Furthermore, when a specific photodiode is fully charged under a high illumination condition during a specific integration time in the photodiode or under a dark condition caused by a large defect source of the photodiode, photogenerated charges may leak to adjacent pixels through the substrate due to the channel blocking of the gate electrode when the NCP bias is not applied to the gate electrode.

SUMMARY

Exemplary embodiments of the present invention are directed to a CMOS image sensor capable of suppressing a blooming phenomenon and crosstalk.

In accordance with an embodiment of the present invention, a CMOS image sensor includes, a substrate, a gate electrode of a transfer transistor formed over the substrate, a photodiode formed over the substrate to be substantially aligned with one side of the gate electrode, a floating diffusion region formed over the substrate to be substantially aligned with the other side of the gate electrode, and a blooming pass region formed below the photodiode.

In accordance with another embodiment of the present invention, a method for fabricating a CMOS image sensor includes forming a substrate, forming a blooming pass region over the substrate, forming a gate electrode over the substrate so that the center of the gate electrode is substantially aligned with one side of the blooming pass region, forming a photodiode over the blooming pass region so that the photodiode is substantially aligned with one side of the gate electrode, and forming a floating diffusion region over the substrate so that the floating diffusion region is substantially aligned with the other side of the gate electrode.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
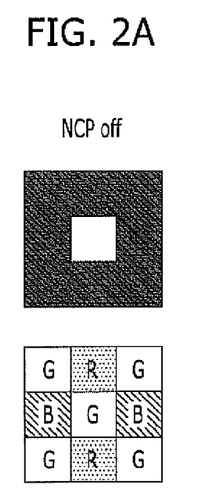
FIGS. 2A to 2C are diagrams for explaining a CMOS image sensor.
Figure 2B:
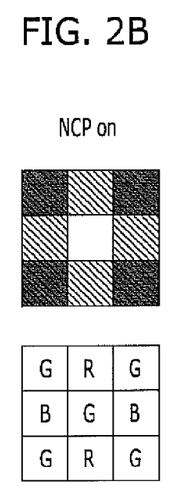
Figure 2C:
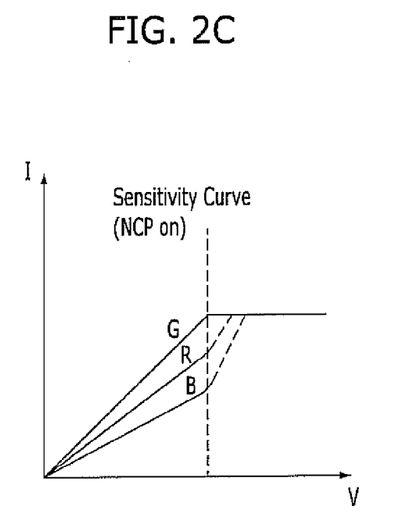

FIGS. 2A to 2C are diagrams for explaining a complementary metal-oxide semiconductor (CMOS) image sensor.

In FIG. 2A, a top drawing illustrates a pixel when light is not irradiated because a negative charge pumping (NCP) bias is not applied to a gate electrode (dark condition), and the pixel is completely saturated by a photodiode leakage source at a specific pixel. In FIG. 2B, a top drawing illustrates when the NCP bias is applied to the gate electrode, showing dark blooming in which photogenerated charges leak to adjacent pixels through a substrate.

In FIGS. 2A and 2B, bottom drawings illustrate that photogenerated charges leak to adjacent pixels at a condition that the NCP bias is applied to the gate electrode, after a green (G) pixel positioned in the center is saturated by light irradiation.

Referring to FIG. 2C, when the same amount of light is irradiated onto the respective pixels and saturation current values based on charges photogenerated by the respective pixels are equal to each other, the pixels generally approach the saturation current values in order of green (G), red (R), and blue (B) pixels due to a sensitivity difference. However, since the time required for the G pixel to approach the saturation current value is shortened compared to the red or blue (R/B) pixels when the NCP bias is applied, the photogenerated charges may diffuse to the R/B pixels adjacent to the G pixel after the G pixel approaches the saturation current value. Then, sensitivity curves of the R/B pixels may be distorted.

Figure 3A:
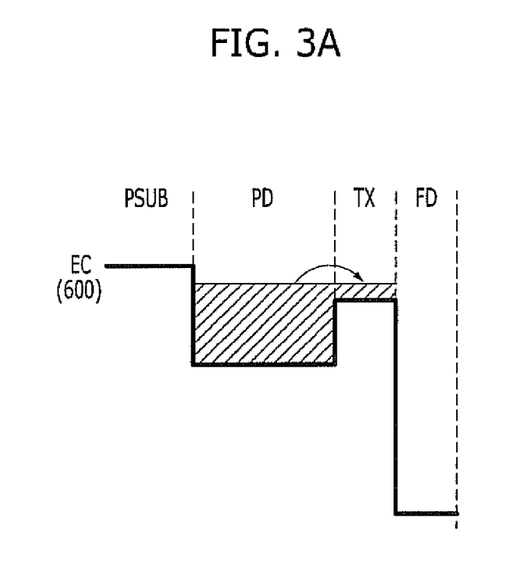
FIGS. 3A and 3B are energy band diagrams of a CMOS image sensor structure.
Figure 3B:
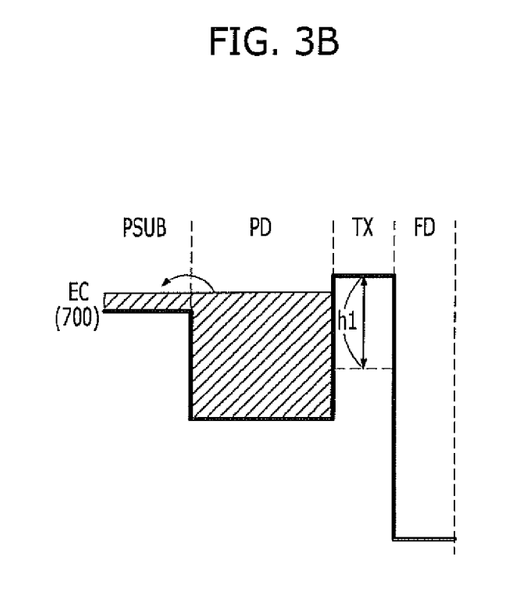

FIGS. 3A and 3B are energy band diagrams of a CMOS image sensor structure.

FIG. 3A is an energy band diagram of a general CMOS image sensor structure, and FIG. 3B is an energy band diagram when an NCP bias is applied to the general CMOS image sensor structure.

Referring to FIG. 3A, it can be seen that a conduction band (EC) 600 of a photodiode PD is lower than a substrate PSUB, a conduction band 600 of a transfer transistor TX is higher than the conduction band 600 of the photo diode PD, and a conduction band 600 of a floating diffusion region FD is lower than the photodiode PD.

Meanwhile, referring to FIG. 3B, it can be seen that a conduction band (EC) 700 of the substrate PSUB is higher than the conduction band of the photodiode PD, the conduction band 700 of the transfer transistor TX is higher than the conduction band 700 of the substrate PSUB, and the conduction band 700 of the floating diffusion region FD is lower than the potential of the photodiode PD.

That is, when the NCP bias is applied, the height of the conduction band 700 of the transfer transistor TX increases by h1, and thereby preventing photogenerated charges of the photodiode from being transferred to the floating diffusion region through a gate electrode. Accordingly, it is possible to suppress an occurrence of a dark current.

However, when the conduction band 700 of the transfer transistor TX becomes higher than the conduction band 700 of the substrate PSUB, blooming may occur. More specifically, when the photogenerated charges are stored beyond the saturation of the photodiode due to irradiation of light onto the photodiode, the photogenerated charges are not controlled beyond the saturation of the photodiode PD when the gate electrode is turned off, but may leak to adjacent pixels through the substrate.

Figure 4:
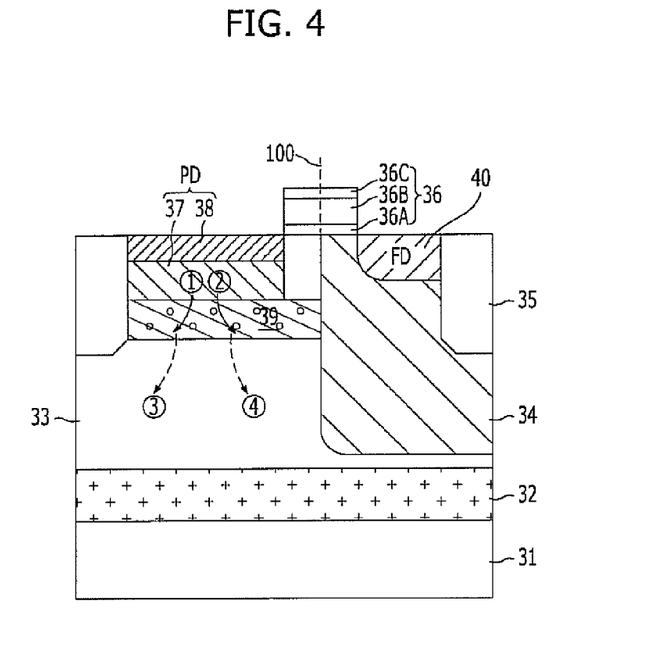
FIG. 4 is a cross-sectional view of a CMOS image sensor in accordance with a first embodiment of the present invention.

FIG. 4 is a cross-sectional view of a CMOS image sensor in accordance with a first exemplary embodiment of the present invention.

Referring to FIG. 4, a punch-through prevention layer 32 is formed over a substrate 31. The punch-through prevention layer 32 is formed by doping the substrate 31 with high-concentration P-type impurities. A silicon epitaxial layer 33, which is epitaxially-grown, is formed over the substrate 31 and the punch-through prevention layer 32. The channel stop region 34 is formed from the surface of the silicon epitaxial layer 33 to be separated from the top of the punch-through prevention layer 32.

A gate dielectric layer 36A is formed over the silicon epitaxial layer 33, a polysilicon layer 36B is formed over the gate dielectric layer 36A, and a tungsten silicide layer 36C is formed over the polysilicon layer 36B, thereby forming a gate electrode 36 of a transfer transistor TX. An N-type diffusion layer 37 is formed so that one side is coupled with one side of the isolation layer 35 inside the silicon epitaxial layer 33, and the other side is substantially aligned with one edge of the gate electrode 36. A P-type diffusion layer 38 is formed over the N-type diffusion layer 37 and below the surface of the silicon epitaxial layer 33 to be substantially aligned with the one edge of the gate electrode 36.

As a result, a photodiode PD that includes the N-type diffusion layer 37 and the P-type diffusion layer 38 is formed. Here, the structure in accordance with the embodiment of the present invention includes a blooming pass region 39 formed below the photodiode PD in the silicon epitaxial layer 33 to suppress a blooming phenomenon, which occurs when an NCP bias is applied. The blooming pass region 39 is formed below the N-type diffusion layer 37 to be substantially aligned with a center 100 of the gate electrode 36. That is, one side of the blooming pass region 39 overlaps the photodiode PD while the other side of the blooming pass region 39 overlaps a part of the gate electrode 36.

Furthermore, one side of the blooming pass region 39 contacts one side of the isolation layer 35 while the other side of the blooming pass region 39 contacts one side of the channel stop region 34.

At this time, the blooming pass region 39 may be formed by ion-implanting phosphorous (P) as a second conductive-type material with proper energy and dose conditions. For example, approximately 200 keV to 400 keV of energy and approximately $1 \times 10^{10}$ dose/cm$^2$ to $3 \times 10^{11}$ dose/cm$^2$ of dose condition may be used. Furthermore, because the ion implantation is performed at a high energy condition, the blooming pass region 39 may be formed to such a depth to reach the punch-through prevention layer 32 inside the silicon epitaxial layer 33, thereby reducing a distance h1 (shown in FIG. 3B) between the blooming pass region 39 and the punch-through prevention layer 32.

Here, the blooming pass region 39 has a higher impurity concentration than the channel stop region 34.

Furthermore, the floating diffusion region 40 doped with N-type impurities is formed to be substantially aligned with one side of the gate electrode 36, while the photodiode PD is substantially aligned with the other side of the gate electrode 36.

In the above-described image sensor in accordance with the first exemplary embodiment of the present invention, the blooming pass region 39 is formed below the photodiode PD. The blooming pass region 39 is formed in the silicon epitaxial layer 33 to overlap a part of the gate electrode 36. Accordingly, the blooming pass region 39 may suppress the occurrence of dark current and blooming. More specifically, when the gate electrode 36 is turned off to apply the NCP bias, a specific pixel photodiode PD may be fully charged under a high illumination condition during a specific integration time of the photodiode PD or under a dark condition caused by a large defect source of the photodiode PD by a channel blocking of the gate electrode 36 based on a barrier increase of the gate electrode 36. In this case, photogenerated charges ① and ② do not leak to adjacent pixels ③ and ④, but are transferred to the floating diffusion region 40 through the blooming pass region 39, which is formed to transfer the leaking photogenerated charges ① and ② to the floating diffusion region 40. Furthermore, since the capacity of the photodiode PD is improved in such a structure, a full depletion region at an on condition of the gate electrode is expanded to the punch-through prevention layer 32. Accordingly, it is possible to improve the photosensitivity, crosstalk, and the saturation level of the pixel.

Figure 5:
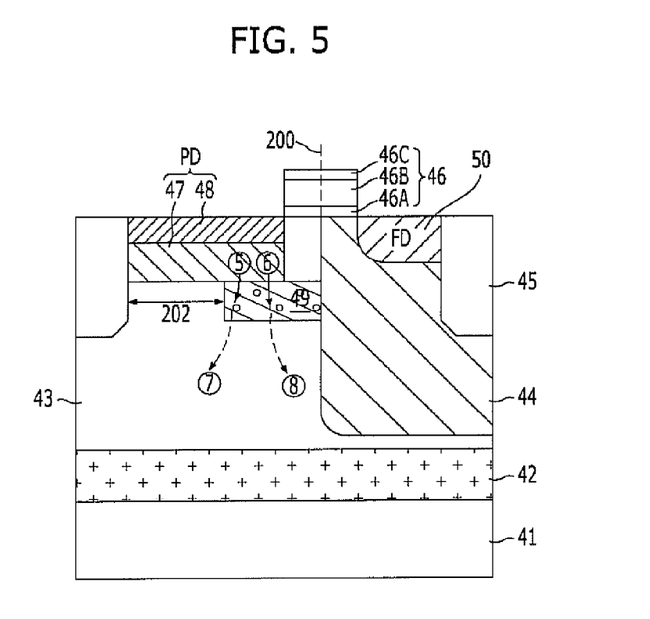
FIG. 5 is a cross-sectional view of a CMOS image sensor in accordance with a second embodiment of the present invention.

FIG. 5 is a cross-sectional view of a CMOS image sensor in accordance with a second exemplary embodiment of the present invention.

Referring to FIG. 5, a punch-through prevention layer 42 is formed over a substrate 41. The punch-through prevention layer 42 is formed by doping the substrate 41 with high-concentration P-type impurities. A silicon epitaxial layer 43, which is epitaxially-grown, is formed over the substrate 41 and the punch-through prevention layer 42. The channel stop region 44 is formed from the surface of the silicon epitaxial layer 43 to be separated from the top of the punch-through prevention layer 42.

A gate dielectric layer 46A is formed over the silicon epitaxial layer 43, a polysilicon layer 46B is formed over the gate dielectric layer 46A, and a tungsten silicide layer 46C is formed over the polysilicon layer 46B, thereby forming a gate electrode 46 of a transfer transistor TX. An N-type diffusion layer 47 is formed to be coupled with one side of the isolation layer 45 inside the silicon epitaxial layer 43, while substantially aligned with one edge of the gate electrode 46. A P-type diffusion layer 48 is formed over the N-type diffusion layer 47 and below the surface of the silicon epitaxial layer 43 to be substantially aligned with the one edge of the gate electrode 46.

As a result, a photodiode PD that includes the N-type diffusion layer 47 and the P-type diffusion layer 48 is formed.

Here, the structure in accordance with the embodiment of the present invention includes a blooming pass region 49 below the photodiode PD in the silicon epitaxial layer 43 to suppress a blooming phenomenon, which occurs when an NCP bias is applied. The blooming pass region 49 is formed in a portion of the silicon epitaxial layer 43 below the N-type diffusion layer 47 to be substantially aligned with a center 200 of the gate electrode 46. In other words, one side of the blooming pass region 49 overlaps a part of the photodiode PD while the other side of the blooming pass region 49 overlaps a part of the gate electrode 46.

Furthermore, one side of the blooming pass region 49 is spaced from one side of the isolation layer 45 at a predetermined distance 202, while the other side surface of the blooming pass region 49 contacts the other side of the channel stop region 44.

At this time, the blooming pass region 49 may be formed by ion-implanting phosphorous (P) as a second conductive-type material at proper energy and dose conditions. For example, approximately 200 keV to 400 keV of energy and approximately $1 \times 10^{10}$ dose/cm$^2$ to $3 \times 10^{11}$ dose/cm$^2$ of dose condition may be used. Furthermore, because the ion implantation is performed at a high energy condition, the blooming pass region 49 may be formed to such a depth to reach the punch-through prevention layer 42 inside the silicon epitaxial layer 43, thereby reducing a distance h1 (shown in FIG. 3B) between the blooming pass region 49 and the punch-through prevention layer 42.

Here, the blooming pass region 49 has a higher impurity concentration than the channel stop region 44.

Furthermore, the floating diffusion region 50 doped with N-type impurities is formed to be substantially aligned with one side of the gate electrode 46, while the photodiode PD is substantially aligned with the other side of the gate electrode 46.

In the above-described image sensor in accordance with the second exemplary embodiment of the present invention, the blooming pass region 49 is formed below the photodiode PD. The blooming pass region 49 is formed in the silicon epitaxial layer 43 so that one side of blooming pass region 49 contacts the one side of the channel stop region 44 while substantially aligned with the center 200. Accordingly, the blooming pass region 49 may suppress the occurrence of blooming. More specifically, when the gate electrode 46 is turned off to apply the NCP bias, a specific pixel photodiode PD may be fully charged under a high illumination condition during a specific integration time of the photodiode PD or under a dark condition caused by a large defect source of the photodiode PD by channel blocking of the gate electrode 46 based on a barrier increase of the gate electrode 46. In this case, photogenerated charges ⑤ and ⑥ do not leak to adjacent pixels ⑦ and ⑧, but are transferred to the floating diffusion region 50 through the blooming pass region 46 that is formed to transfer the leaking photogenerated charges ⑤ and ⑥ to the floating diffusion region 50. Furthermore, since the capacity of the photodiode PD is improved in such a structure, a full depletion region at an on condition of the gate electrode 46 is expanded to the punch-through prevention layer 42. Accordingly, it is possible to improve the photosensitivity, crosstalk, and the saturation level of the pixel.

FIGS. 6A to 6G are cross-sectional view illustrating a method for fabricating the CMOS image sensor in accordance with the first embodiment of the present invention.

Figure 6A:
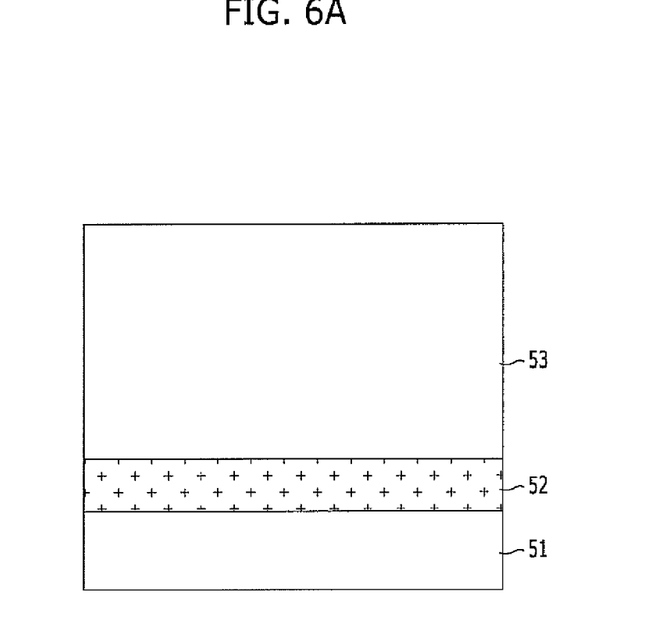
FIGS. 6A to 6G are cross-sectional view illustrating a method for fabricating the CMOS image sensor in accordance with the first embodiment of the present invention.

Referring to FIG. 6A, a punch-through prevention layer 52 is formed over a substrate 51. The punch-through layer 52 may include an impurity layer formed by doping the substrate 51 with high-concentration P-type impurities.

The impurities for forming the punch-through prevention layer 52 may include P-type impurities, for example, boron (B). The doping concentration of the impurities may be set to at least $1\times10^{18}$ atoms/cm$^2$, in order to secure the characteristics of the punch-through prevention layer 52.

A silicon epitaxial layer 53 is formed over the substrate 51 and the punch-through prevention layer 52. In the silicon epitaxial layer 53, components of the CMOS image sensor, such as a photodiode, are formed, and the silicon epitaxial layer 53 is formed to have a single-crystal state. The silicon epitaxial layer 53 having a single-crystal state may be formed, for example, by an epitaxial growth method.

The silicon epitaxial layer 53 may include a silicon epitaxial layer doped with impurities. The impurities may have the same conductive type (P-type) as the punch-through prevention layer 52, and have a lower doping concentration than the punch-through prevention layer 52.

Here, the reason why the silicon epitaxial layer 53 is grown is as follows. When the silicon epitaxial layer 53 exists, the depletion layer depth of the photodiode PD may be increased to obtain a desirable photosensitivity characteristic. Furthermore, a crosstalk between unit pixels, which is caused by irregular motions of electrons generated at deep portions of the punch-through prevention layer 52 where the depletion layer of the photodiode PD does not reach, may be prevented by recombining the electrons through the punch-through prevention layer 52.

Figure 6B:
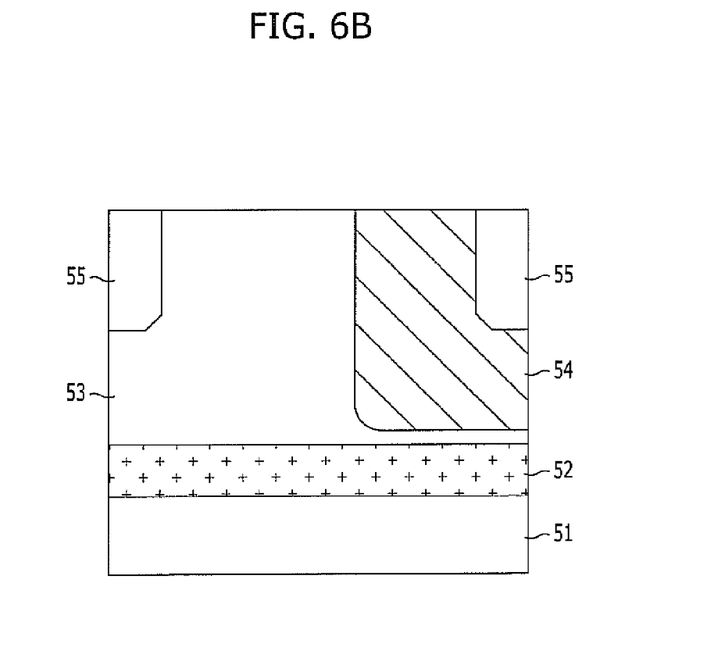

Referring to FIG. 6B, a channel stop region 54 may be formed, for example, by ion-implanting low concentration P-type impurities into a portion of the silicon epitaxial layer 53 where an isolation layer is to be formed.

Although not illustrated, the channel stop region 54 may be formed by the following process. First, an ion implantation mask for forming the channel stop region 54 is formed over the silicon epitaxial layer 53. Then, low concentration P-type impurities, for example, boron ($B_{11}$) are ion-implanted into the exposed silicon epitaxial layer 53 using the ion implantation mask, thereby forming the channel stop region 54. When the impurities for forming the channel stop region 54 are ion-implanted, the impurities may be implanted without a tilt, or be implanted while rotated or twisted with a tilt.

An isolation layer 55 for isolating adjacent unit pixels is formed in the silicon epitaxial layer 53.

Although not illustrated, an isolation mask is formed over the silicon epitaxial layer 53, to form the isolation layer 55. At this time, a mask process for forming the isolation mask may include a shallow trench isolation (STI) process.

For example, pad oxide and pad nitride are sequentially deposited on the silicon epitaxial layer 53, and photoresist is applied onto the pad nitride. Then, a patterning process that includes exposure and development is performed to form the isolation mask for forming a trench.

The pad oxide and the pad nitride, which are exposed by the isolation mask, are simultaneously etched to partially expose the surface of the silicon epitaxial layer 53. Then, the exposed silicon epitaxial layer 53 is etched to a predetermined depth toward the punch-through prevention layer 52, thereby forming a trench.

After the isolation mask is removed, oxide is deposited on the entire surface of the resulting structure, including the trench, by chemical vapor deposition (CVD) exhibiting a desirable gap-fill characteristic, and may be planarized by chemical mechanical polishing (CMP) until the pad nitride and the pad oxide are removed. The planarized oxide may be isotropically etched by wet etching to form the isolation layer 55 buried in the trench.

Figure 6C:
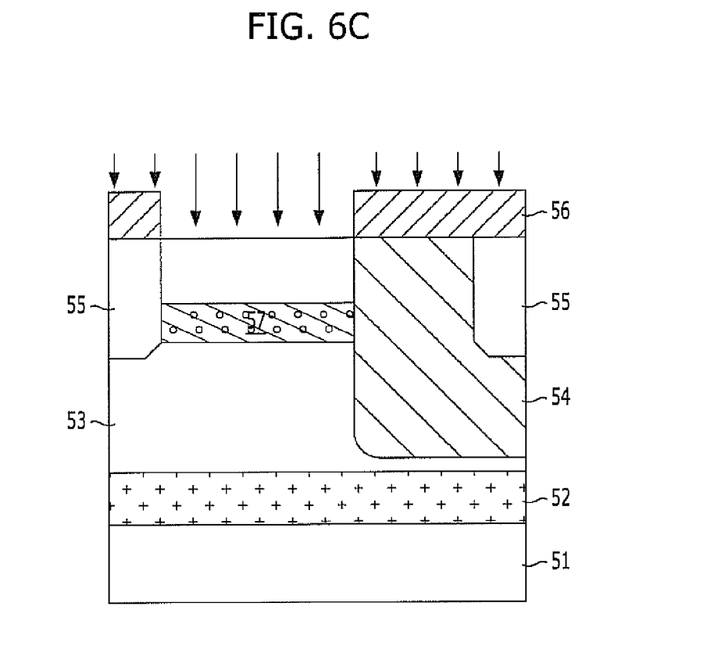

Referring to FIG. 6C, a blooming pass region 57 is formed in the silicon epitaxial layer 53. The blooming pass region 57 collects electrons, which are not stored in the photodiode PD and are susceptible to leakage to other unit pixels.

The blooming pass region 57 may be formed by the following process.

First, photoresist is applied on the silicon epitaxial layer 53 and then selectively patterned to form a first mask 56 for ion-implanting N-type impurities.

At this time, one side of the first mask 56 is substantially aligned with one side of the channel stop region 54, and the other side of the first mask 56 is substantially aligned with a predetermined portion of the isolation layer 55, thereby exposing the surface of the silicon epitaxial layer 53 where the blooming pass region 57 is to be formed.

Using the first mask 56 as an ion implantation mask, N-type impurities are ion-implanted to form the blooming pass region 57 in the silicon epitaxial layer 53.

At this time, one side of the blooming pass region 57 contacts one side of the isolation layer 55, and the other side surface of the blooming pass region 57 contacts one side surface of the channel stop region 54.

The blooming pass region 57 may be formed by ion-implanting N-type impurities (P) into the silicon epitaxial layer 53 at proper energy and dose conditions. For example, approximately 200 keV to 400 keV of energy and approximately $1\times10^{10}$ dose/cm$^2$ to $3\times10^{11}$ dose/cm$^2$ of dose condition may be used. Furthermore, because the ion implantation is performed at a high energy condition, the blooming pass region 57 may be formed to such a depth to reach the punch-through prevention layer 52 inside the silicon epitaxial layer 53, thereby reducing a distance h1 (shown in FIG. 3B) between the blooming pass region 57 and the punch-through prevention layer 52.

The position and depth of the blooming pass region 57 may be controlled based on the energy and dose conditions.

Figure 6D:
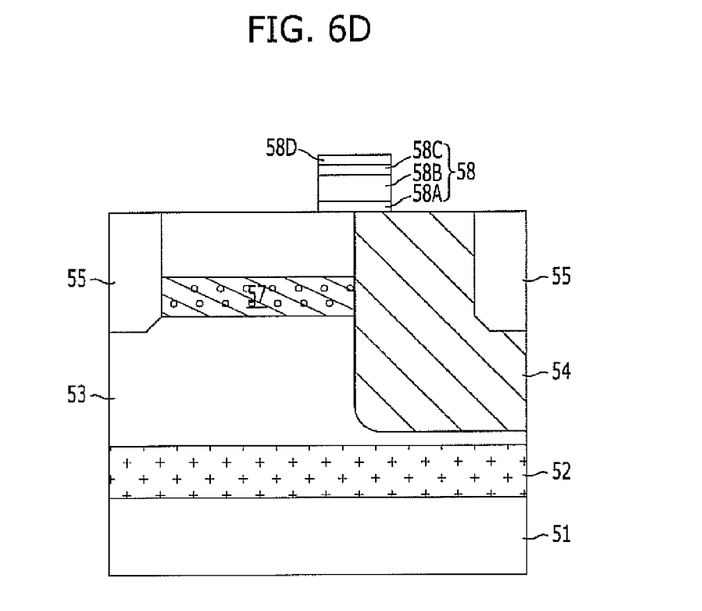

Referring to FIG. 6D, after the blooming pass region 57 is formed by the above-described process, a gate dielectric layer 58A is formed over the silicon epitaxial layer 53 so that one side of the blooming pass region 57 is substantially aligned with the center of a subsequent gate electrode. A polysilicon layer 58B, a tungsten silicide layer 58C, and a sacrificial oxide layer 58D are sequentially deposited over the gate dielectric layer 58A.

The sacrificial oxide layer 58D, the tungsten silicide layer 58C, the polysilicon layer 58B, and the gate dielectric layer 58A are simultaneously patterned to form a gate electrode 58 of a transistor of a unit pixel, for example, a transfer transistor.

At this time, the gate electrode 58 is formed in such a manner that the center 300 (shown in FIG. 6G) of the gate electrode is substantially aligned with one side surface of the blooming pass region 57.

Figure 6E:
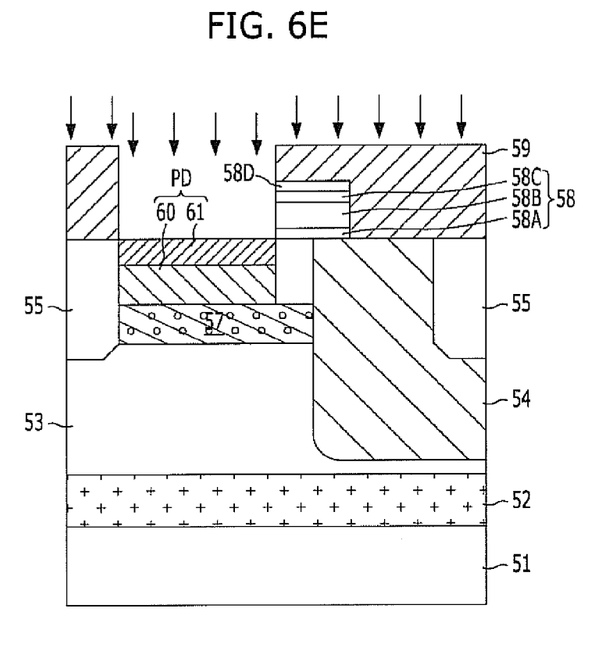

Referring to FIG. 6E, photoresist is applied to the entire surface of the resulting structure including the sacrificial oxide layer 58D, and selectively patterned to form a second mask 59 for ion-implanting low-concentration N-type impurities at a high energy condition.

At this time, one side of the second mask 59 is substantially aligned with one side of the gate electrode including the sacrificial oxide layer 58D, and the other side of the second mask 59 is substantially aligned with a predetermined portion of the isolation layer 55, thereby exposing the surface of the silicon epitaxial layer 53 where the photodiode is to be formed.

Using the second mask 59 as an ion implantation mask, N-type impurities are ion-implanted to form an N-type diffusion layer 60 over the surface of the blooming pass region 57.

At this time, one side of the N-type diffusion layer 60 is substantially aligned with one side of the gate electrode 58, and the other side of the N-type diffusion layer 60 contacts one side surface of the isolation layer 55.

Then, the second mask 59 is reused to form a P-type diffusion layer 61 over the silicon epitaxial layer 53 exposed by the second mask 59, that is, over the N-type diffusion layer 60 and below the surface of the silicon epitaxial layer 53, such that the P-type diffusion layer 61 is substantially aligned with the one side of the gate electrode 58.

Through the above-described ion implantation process of P-type impurities, a PN junction that includes the P-type diffusion layer 61 and the N-type diffusion layer 60 is formed, and an expanded photodiode that includes the silicon epitaxial layer 53, the blooming pass region 57, the N-type diffusion layer 60, and the P-type diffusion layer 61 is formed.

Figure 6F:
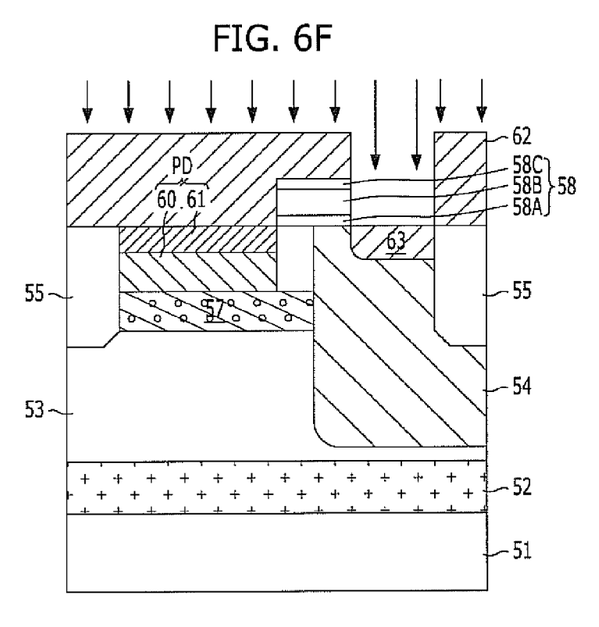

Referring to FIG. 6F, the second mask 59 and the sacrificial layer 58D are removed, and a photoresist is applied onto the entire surface of the resulting structure and patterned through exposure and development to form a third mask 62 exposing the channel stop region 54.

Figure 6G:
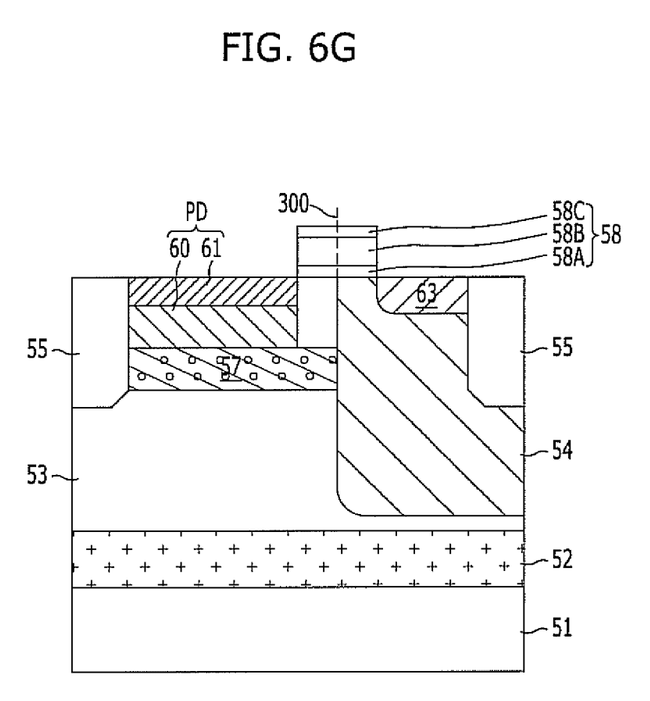

Using the third mask 62 as an ion implantation mask, N-type impurities are ion-implanted to form a floating diffusion region 63. Then, the third mask 62 is removed to complete the CMOS sensor as illustrated in FIG. 6G.

In accordance with the embodiments of the present invention, the blooming pass region is formed below the photodiode, thereby suppressing blooming and crosstalk. Furthermore, it is possible to suppress blooming and crosstalk, which occur when a negative charge pumping voltage is applied to the gate electrode. In addition, as the capacitor area of the photodiode is sufficiently secured, it is possible to improve the photosensitivity.

While the present invention has been described with respect to the specific embodiments, it will be apparent to those skilled in the art that various changes and modifications may be made without departing from the spirit and scope of the invention as defined in the following claims.

What is claimed is:

1. A CMOS image sensor comprising:
    a substrate;
    a gate electrode of a transfer transistor formed over the substrate;
    a photodiode formed over the substrate to be substantially aligned with one side of the gate electrode;
    a floating diffusion region formed over the substrate to be substantially aligned with the other side of the gate electrode; and
    a blooming pass region formed below the photodiode,
    wherein one side of the blooming pass region overlaps the photodiode, and the other side of the blooming pass region overlaps a part of the gate electrode.

2. The CMOS image sensor of claim 1, wherein one side of the blooming pass region is substantially aligned with a center of the gate electrode.

3. The CMOS image sensor of claim 1, wherein one side of the blooming pass region overlaps a part of the photodiode, and the other side of the blooming pass region overlaps a part of the gate electrode.

4. The CMOS image sensor of claim 1, wherein the photodiode comprises a P-type diffusion layer formed at the surface of the substrate and an N-type diffusion layer formed below the P-type diffusion layer, and the blooming pass region contacts the N-type diffusion layer.

5. The CMOS image sensor of claim 4, wherein the blooming pass region is doped with N-type impurities.

6. The CMOS image sensor of claim 1, wherein the blooming pass region contacts a bottom surface of the photodiode to collect photogenerated charges which are not stored in the photodiode when the gate electrode is turned off to supply a negative charge pumping voltage.

7. The CMOS image sensor of claim 1, further comprising:
    a channel stop region formed below the floating diffusion region.

8. The CMOS image sensor of claim 7, wherein the blooming pass region has a higher impurity doping concentration than the channel stop region.

9. The CMOS image sensor of claim 7, wherein one side of the channel stop region is substantially aligned with the center of the gate electrode to contact the one side of the blooming pass region.

10. A method for fabricating a CMOS image sensor, comprising:
    forming a substrate;
    forming a blooming pass region over the substrate;
    forming a gate electrode over the substrate so that the center of the gate electrode is substantially aligned with one side of the blooming pass region;
    forming a photodiode over the blooming pass region so that the photodiode is substantially aligned with one side of the gate electrode; and
    forming a floating diffusion region over the substrate so that the floating diffusion region is substantially aligned with the other side of the gate electrode,
    wherein the blooming pass region is formed to overlap the entire surface of the photodiode and a part of the gate electrode.

11. The method of claim 10, further comprising:
    forming a channel stop region, before the formation of the blooming pass region, wherein the channel stop region contacts the floating diffusion region.

12. The method of claim 10, wherein the blooming pass region is formed to overlap a part of the photodiode and a part of the gate electrode.

13. The method of claim 10, wherein the blooming pass region is formed by implanting N-type impurities.

14. The method of claim 10, wherein the blooming pass region is formed by implanting phosphorous at energy and dose conditions of approximately 200keV to 400keV and approximately $1 \times 10^{10}$ dose/cm$^2$ to $3 \times 10^{11}$ dose/cm$^2$, respectively.

15. The method of claim 10, wherein the photodiode comprises a first diffusion layer of a first-type and a second diffusion layer of a second-type formed below the first diffusion layer, and the blooming pass region of the second-type contacts the second diffusion layer.

16. The method of claim 15, wherein the first-type is a P-type impurities and the second-type is an N-type impurities.

* * * * *